United States Patent
Nakamura (10) Patent No.: US 8,659,214 B2
(45) Date of Patent: Feb. 25, 2014

(54) PIEZOELECTRIC ACTUATOR INCLUDING DOUBLE PZT PIEZOELECTRIC LAYERS WITH DIFFERENT PERMITIVITIES AND ITS MANUFACTURING METHOD

(75) Inventor: Susumu Nakamura, Yokohama (JP)

(73) Assignee: Stanley Electric Co., Ltd., Tokyo (JP)

( * ) Notice: Subject to any disclaimer, the term of this patent is extended or adjusted under 35 U.S.C. 154(b) by 76 days.

(21) Appl. No.: 13/403,583

(22) Filed: Feb. 23, 2012

(65) Prior Publication Data

US 2012/0217847 A1    Aug. 30, 2012

(30) Foreign Application Priority Data

Feb. 24, 2011   (JP) .................................. 2011-037868

(51) Int. Cl.
*H01L 41/08* (2006.01)

(52) U.S. Cl.
USPC ............ 310/367; 310/365; 310/366; 310/358

(58) Field of Classification Search
USPC ......... 310/328, 367–368, 311, 357–358, 359, 310/320–321
IPC ...................................................... H01L 41/08
See application file for complete search history.

(56) References Cited

U.S. PATENT DOCUMENTS

| | | | | |
|---|---|---|---|---|
| 3,590,287 A | * | 6/1971 | Berlincourt et al. | 310/366 |
| 5,118,982 A | * | 6/1992 | Inoue et al. | 310/366 |
| 6,767,086 B2 | * | 7/2004 | Murai | 347/70 |
| 2013/0200748 A1 | * | 8/2013 | Nakamura | 310/311 |

FOREIGN PATENT DOCUMENTS

| | | |
|---|---|---|
| JP | 2000-094681 A | 4/2000 |
| JP | 2001-223403 A | 8/2001 |
| JP | 2001-234331 A | 8/2001 |
| JP | 2003-081694 A | 3/2003 |
| JP | 2003-188431 A | 7/2003 |
| JP | 2007-335779 A | 12/2007 |

* cited by examiner

*Primary Examiner* — Thomas Dougherty
*Assistant Examiner* — Karen B Addison
(74) *Attorney, Agent, or Firm* — Holtz, Holtz, Goodman & Chick (57) ABSTRACT

In a piezoelectric actuator including a lower electrode layer, a first PZT piezoelectric layer having a first relative permittivity is formed on the lower electrode layer, and a second PZT piezoelectric layer having a second relative permittivity smaller than said first relative permittivity is formed on the first PZT piezoelectric layer.

4 Claims, 15 Drawing Sheets

PIEZOELECTRIC ACTUATOR INCLUDING DOUBLE PZT PIEZOELECTRIC LAYERS WITH DIFFERENT PERMITIVITIES AND ITS MANUFACTURING METHOD

This application claims the priority benefit under 35 U.S.C. §119 to Japanese Patent Application No. JP2011-037868 filed on Feb. 24, 2011, which disclosure is hereby incorporated in its entirety by reference.

BACKGROUND

1. Field

The presently disclosed subject matter relates to a piezoelectric actuator including lead titanate zirconate (PZT) and its manufacturing method.

2. Description of the Related Art

Figure 6:
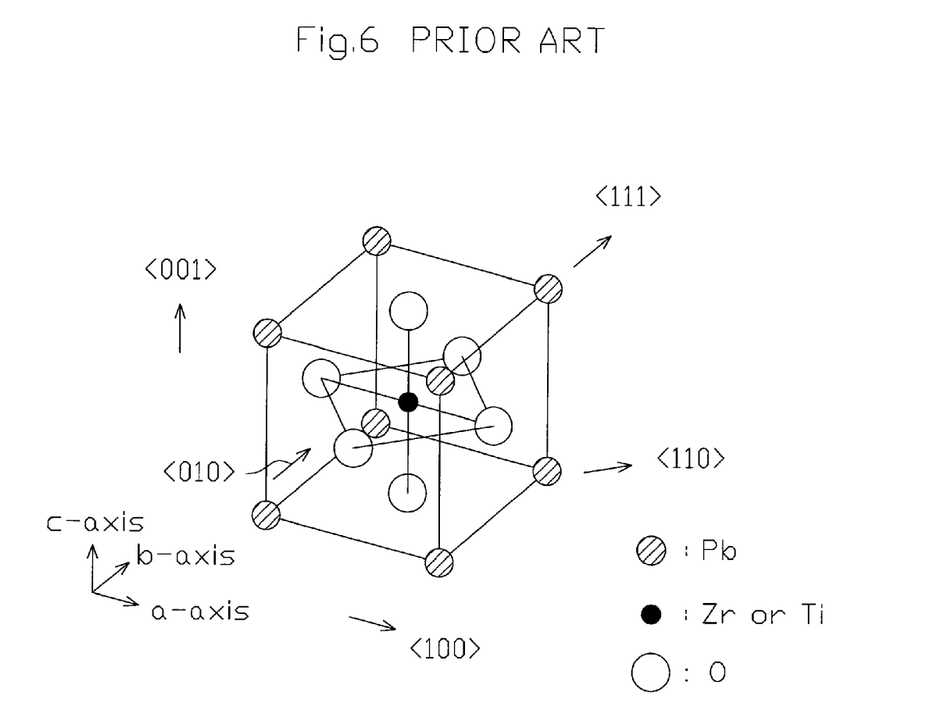
FIG. 6 is a diagram illustrating a crystal structure of PZT.
Figure 7:
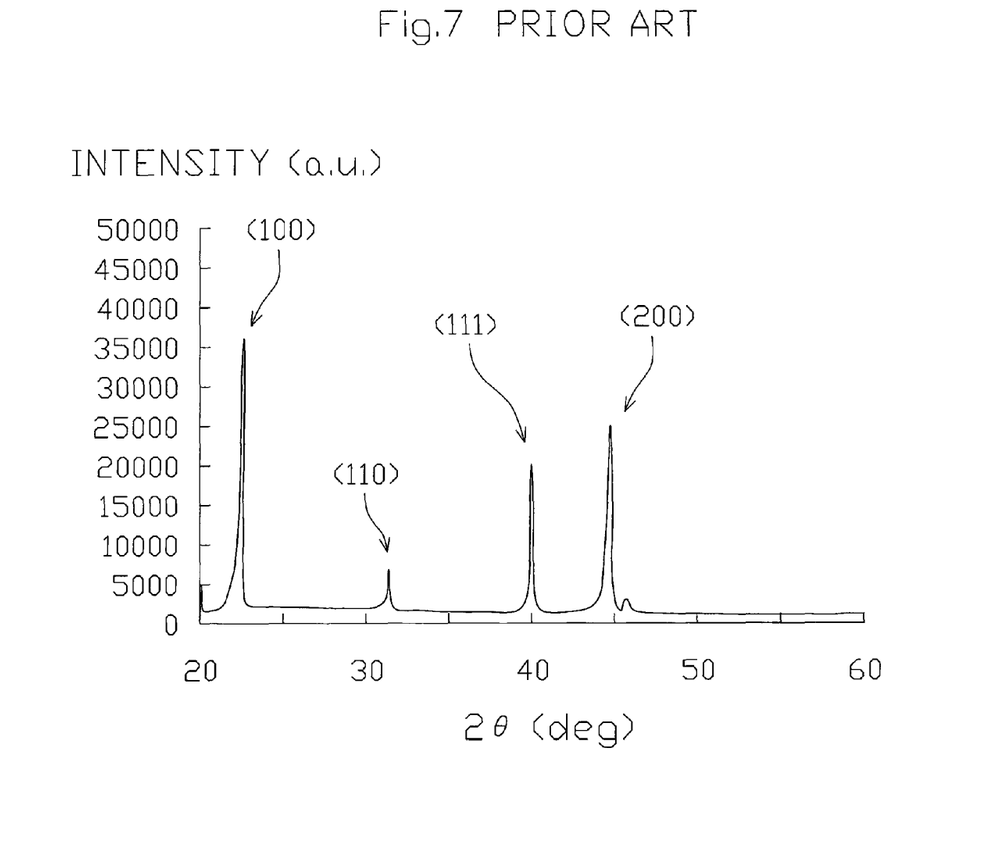
FIG. 7 is a graph illustrating an X-ray diffractive pattern of PZT.

Lead titanate zirconate $PbZr_xTi_{1-x}O_3$ (PZT), which is an oxide compound including lead (Pb), zirconium (Zr) and titanium (Ti), has a simple cubic-system perovskite crystal structure as illustrated in FIG. 6. In FIG. 6, note that a shaded sphere indicates Pb, a black sphere indicates Zr or Ti, and a white sphere indicates O. As illustrated in FIG. 7, which is a graph for showing an X-ray diffractive pattern of PZT, PZT generates a polarization when PZT is distorted along its <100> direction or <111> direction, thus exhibiting an excellent piezoelectric characteristic when PZT has an orientation of (100) or (111) (see: FIGS. 5 and 10 of JP2003-81694A). That is, the crystal structure of PZT constitutes a tetragonal-system or a rhombohedral-system. In the tetragonal-system crystal structure of PZT, the largest piezoelectric displacement is obtained along the <100> direction (the a-axis direction) (or the <001> direction (the c-axis direction)), while, in the rhombohedral-system crystal structure of PZT, the largest piezoelectric displacement is obtained along the <111> direction. Also, as to the breakdown voltage characteristic which is an important characteristic for piezoelectric actuators, titanium (Ti)-rich (x<0.5) tetragonal-system PZTs are advantageous over rhombohedral-system PZTs. Therefore, PZT piezoelectric layers using such tetragonal-system PZTs are used for micro electromechanical systems (MEMS) elements as actuators, MEMS elements as sensors, electricity generating elements, gyro elements and so on.

Figure 8:
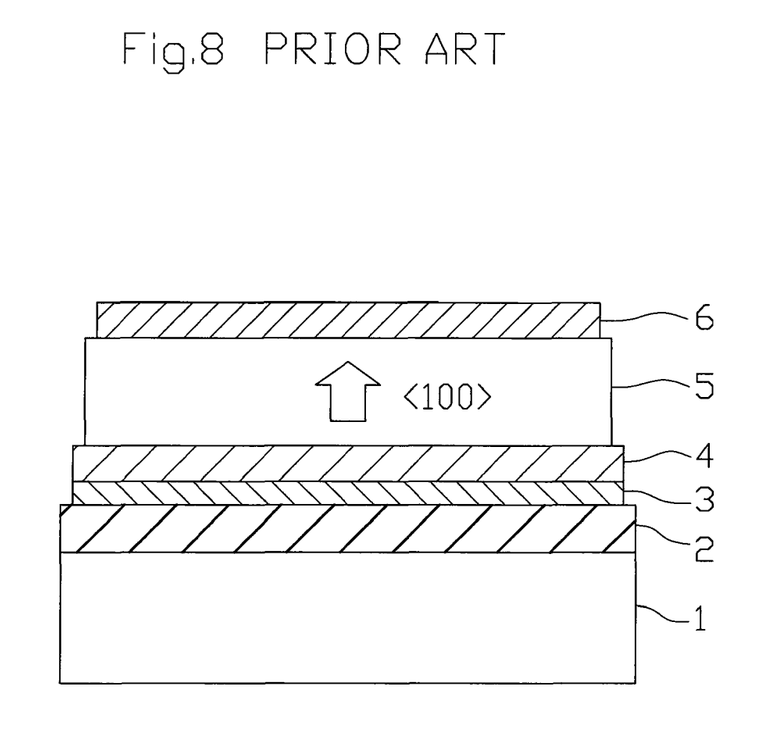
FIG. 8 is a cross-sectional view illustrating a first prior art piezoelectric actuator.

In FIG. 8, which is a cross-sectional view illustrating a first prior art piezoelectric actuator, this piezoelectric actuator is of a laminated capacitor type which includes a monocrystalline silicon substrate 1, a silicon oxide ($SiO_2$) layer 2, a titanium (Ti) adhesive layer 3, a platinum (Pt) lower electrode layer 4, a tetragonal-system PZT piezoelectric layer 5 and a Pt upper electrode layer 6. In this case, the monocrystalline silicon substrate 1 can be replaced by a silicon-on-insulator (SOI) substrate. Also, the Pt lower electrode layer 4 may be made of Ir, $SrAuO_3$ or the like. Also, since the silicon oxide layer 2 has bad adhesion characteristics with the Pt lower electrode layer 4, the Ti adhesive layer 3 is interposed therebetween in order to improve the adhesion characteristics between the silicon oxide layer 2 and the Pt lower electrode layer 4 and relax a stress therebetween. The adhesive layer 3 may be made of Cr or conductive oxide such as $TiO_2$, MgO, $ZrO_2$, $IrO_2$ or the like.

In FIG. 8, when the direction of the PZT piezoelectric layer 5 as indicated by an arrow is along the <100> direction or the <001> direction, distortion is effectively generated by applying a voltage between the Pt lower electrode layer 4 and the Pt upper electrode layer 6.

A method for manufacturing the piezoelectric actuator of FIG. 8 is explained next with reference to FIG. 9.

First, referring to step 901, a monocrystalline silicon substrate 1 is thermally oxidized to grow a silicon oxide ($SiO_2$) layer 2 thereon. In this case, note that a chemical vapor deposition (CVD) process can be used instead of the thermal oxidization process.

Next, referring to step 902, a Ti adhesive layer 3 is formed by a sputtering process using Ar gas on the silicon oxide layer 2. Subsequently, a Pt lower electrode layer 4 is formed by a sputtering process using Ar gas on the Ti adhesive layer 3.

Next, referring to step 903, a PZT piezoelectric layer 5 is formed by a sputtering process using Ar gas and $O_2$ gas on the lower electrode layer 4 (see: JP2001-223403A). In this case, a CVD process may be used instead of the sputtering process. Or, a sol-gel process may be used instead of the sputtering process (see: JP2000-94681A). In the sol-gel process, note that, since a thick PZT piezoelectric layer cannot be grown at once, thin PZT layers are repeatedly formed and baked to obtain a PZT piezoelectric layer having a predetermined thickness by accumulating such layers.

Finally, referring to step 904, a Pt upper electrode layer 6 is formed by a sputtering process using Ar gas on the PZT piezoelectric layer 5.

At steps 902 and 904, note that electron-beam (EB) evaporation process may be used instead of the sputtering process.

In the first prior art piezoelectric actuator as illustrated in FIG. 8, however, even when the PZT piezoelectric layer 5 having an orientation of (100) or (111) is formed on the Pt lower electrode layer 4, since the Pt lower electrode layer 4 is polycrystalline, the crystal structure of the PZT piezoelectric layer 5 fluctuates so that the orientation of PZT would deteriorate, i.e., the piezoelectric characteristics of PZT would deteriorate.

Figure 10:
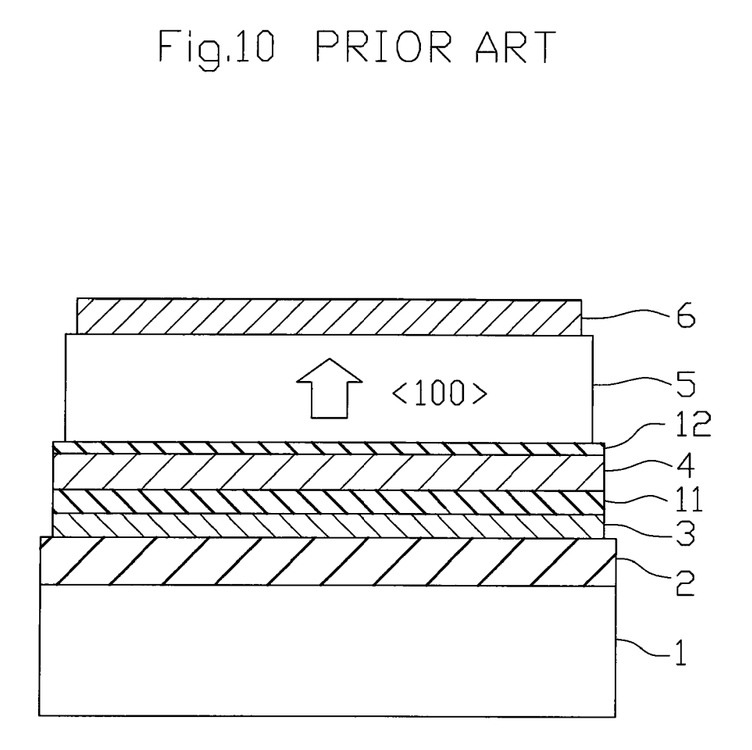
FIG. 10 is a cross-sectional view illustrating a second prior art piezoelectric actuator.

In FIG. 10, which is a cross-sectional view illustrating a second prior art piezoelectric actuator (see: FIG. 1 of JP2003-188431A), orientation control layers 11 and 12 are added to the elements of FIG. 8 in order to improve the piezoelectric characteristics. In this case, the orientation control layer 11 is an oxide layer having an orientation of (100), the Pt lower electrode layer 4 has an orientation of (100), and the orientation control layer 12 is a perovskite oxide layer having an orientation of (100) or (001). Thus, the crystallizability of the Pt lower electrode layer 4 does not affect the columnar structure of the PZT piezoelectric layer 5 grown by the sputtering process or the like. Also, a low crystallizability layer made of Zr oxide is never grown at the initial growth stage of the PZT piezoelectric layer 5. As a result, the orientation and piezoelectric characteristics of the PZT piezoelectric layer 5 can be improved.

Figure 9:
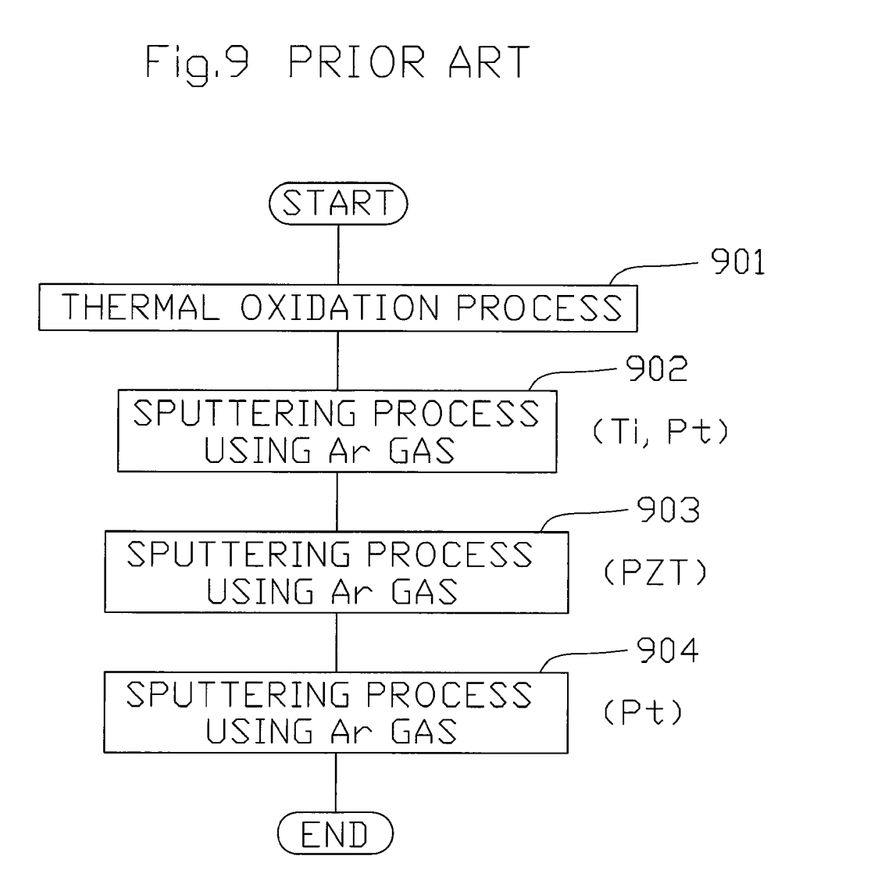
FIG. 9 is a flowchart for explaining a method for manufacturing the piezoelectric actuator of FIG. 8.

In a method for manufacturing the second prior art piezoelectric actuator illustrated in FIG. 10, however, since steps for forming the orientation control layers 11 and 12 are added to the manufacturing steps of FIG. 9, the manufacturing steps are so complex that there is a possibility that foreign particles may be easily trapped. Therefore, the piezoelectric characteristics cannot be so improved. Also, the process margin would be decreased in view of the crystallizability of the upper layer (the monocrystalline silicon substrate 1) through the upper layer (the orientation control layer 12).

Figure 11:
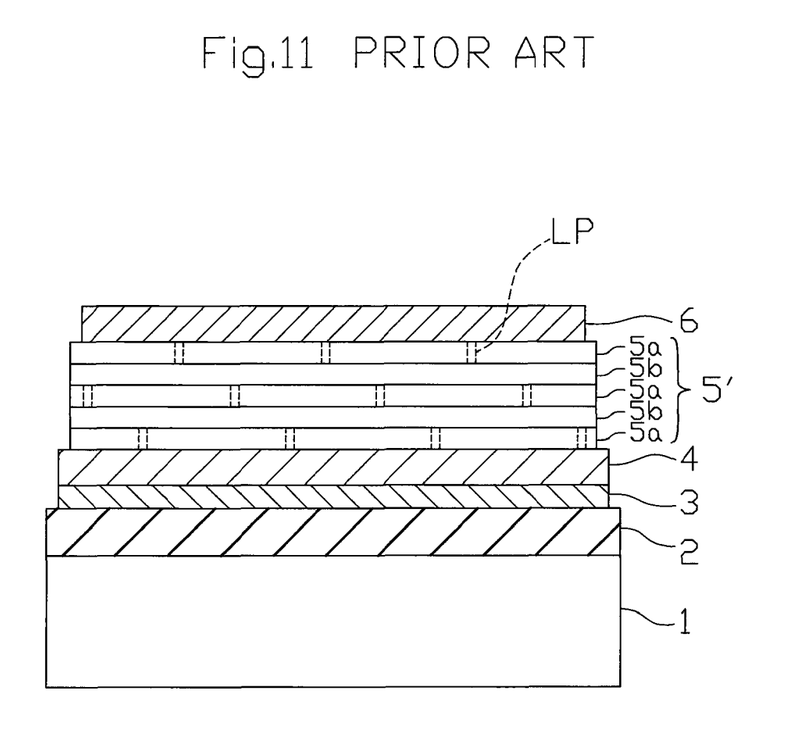
FIG. 11 is a cross-sectional view illustrating a third prior art piezoelectric actuator.

In FIG. 11, which is a cross-sectional view illustrating a third prior art piezoelectric actuator (see: FIG. 1 of JP2007-335779A), a piezoelectric layer 5' including a plurality of Pb-rich PZT piezoelectric layers 5a and a plurality of Pb-lean PZT piezoelectric layers 5b alternating with each other is provided instead of the PZT piezoelectric layer 5 of FIG. 8. That is, if a PZT piezoelectric layer is grown in a Pb-rich atmosphere to have a perovskite crystal structure including a greater amount of Pb than the stoichiometric composition amount, the process margin is large; however, such a Pb-rich perovskite crystal structure includes a lot of conductive lead oxide in its grain boundaries, to thereby to deteriorate the breakdown voltage characteristics. On the other hand, if a PZT piezoelectric layer is grown in Pb-lean atmosphere to have a perovskite crystal structure including a slightly smaller amount of Pb than the stoichiometric composition amount, the process margin is small; however, such a Pb-lean perovskite crystal structure includes only a small amount of conductive lead oxide in its grain boundaries, to thereby to improve the breakdown voltage characteristics. Therefore, in the piezoelectric layer 5' formed by laminating the Pb-rich PZT piezoelectric layers 5a and the Pb-lean PZT piezoelectric layers 5b, even when leakage paths LP are generated within the Pb-rich PZT piezoelectric layer 5a due to the conductive lead oxide thereof, such leakage paths LS are shut off by the Pb-lean PZT piezoelectric layers 5b, to thereby improve the breakdown voltage characteristics.

In the third prior art piezoelectric actuator as illustrated in FIG. 11, however, the crystal growth of the Pb-rich PZT piezoelectric layers 5a and the Pb-lean PZT piezoelectric layers 5b are discontinuous. As a result, the discontinuous portions, i.e., the interfaces between the Pb-rich PZT piezoelectric layers 5a and the Pb-lean PZT piezoelectric layers 5b would be cracked or peeled off due to the mechanical vibration of the piezoelectric actuator of FIG. 11, and thus, the piezoelectric actuator of FIG. 11 would be damaged.

Figure 12:
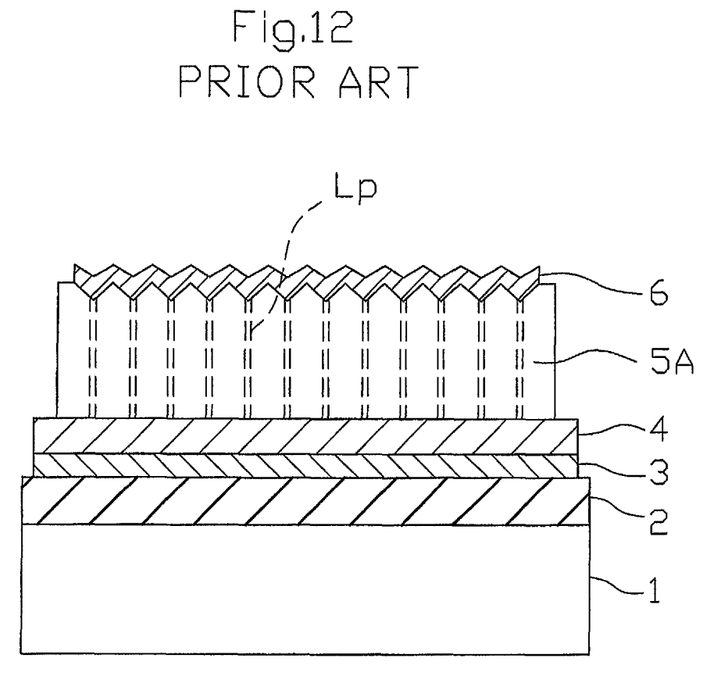
FIG. 12 is a cross-sectional view illustrating a fourth prior art piezoelectric actuator.

In FIG. 12, which is a cross-sectional view illustrating a fourth prior art piezoelectric actuator, in order to improve the piezoelectric characteristics and the breakdown voltage characteristics, a tetragonal-system PZT piezoelectric layer 5A close to a morphotropic phase boundary (MPB) is provided instead of the PZT piezoelectric layer 5 of FIG. 8. The tetragonal-system PZT exhibits a high breakdown voltage characteristic, while the PZT of the morphotropic phase boundary (MPB) exhibits a high piezoelectric performance. In this case, the composition x of $PbZr_xTi_{1-x}O_3$ in MPB is x=0.52, and when x<0.52, $PbZr_xTi_{1-x}O_3$ has a tetragonal crystal structure. A method for manufacturing the piezoelectric actuator of FIG. 12 is illustrated in FIG. 13 whose step 1301 forms the tetragonal-system PZT piezoelectric layer 5A whose composition x is close to around 0.52 of MPB by an arc discharge reactive ion plating (ADRIP) process.

Figure 13:
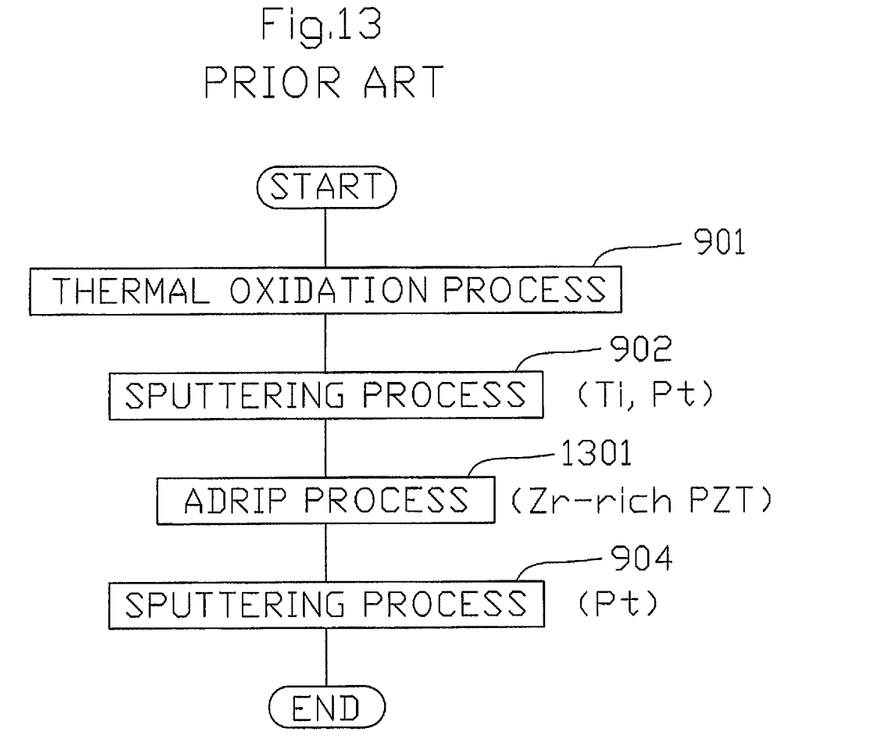
FIG. 13 is a flowchart for explaining a method for manufacturing the piezoelectric actuator of FIG. 12.

The ADRIP process at step 1301 of FIG. 13 has an advantage in that the deposition speed of PZT is higher than the sputtering process. Also, the ADRIP process has an advantage in that the substrate temperature is lower, the manufacturing cost is lower, and it is more eco-efficient and more efficient in utilization of materials over the metal organic chemical vapor deposition (MOCVD) process using poisonous organic metal gas.

An ADRIP apparatus used for carrying out the ADRIP process at step 1301 is explained next with reference to FIG. 14 (see: FIG. 1 of JP2001-234331A).

Figure 14:
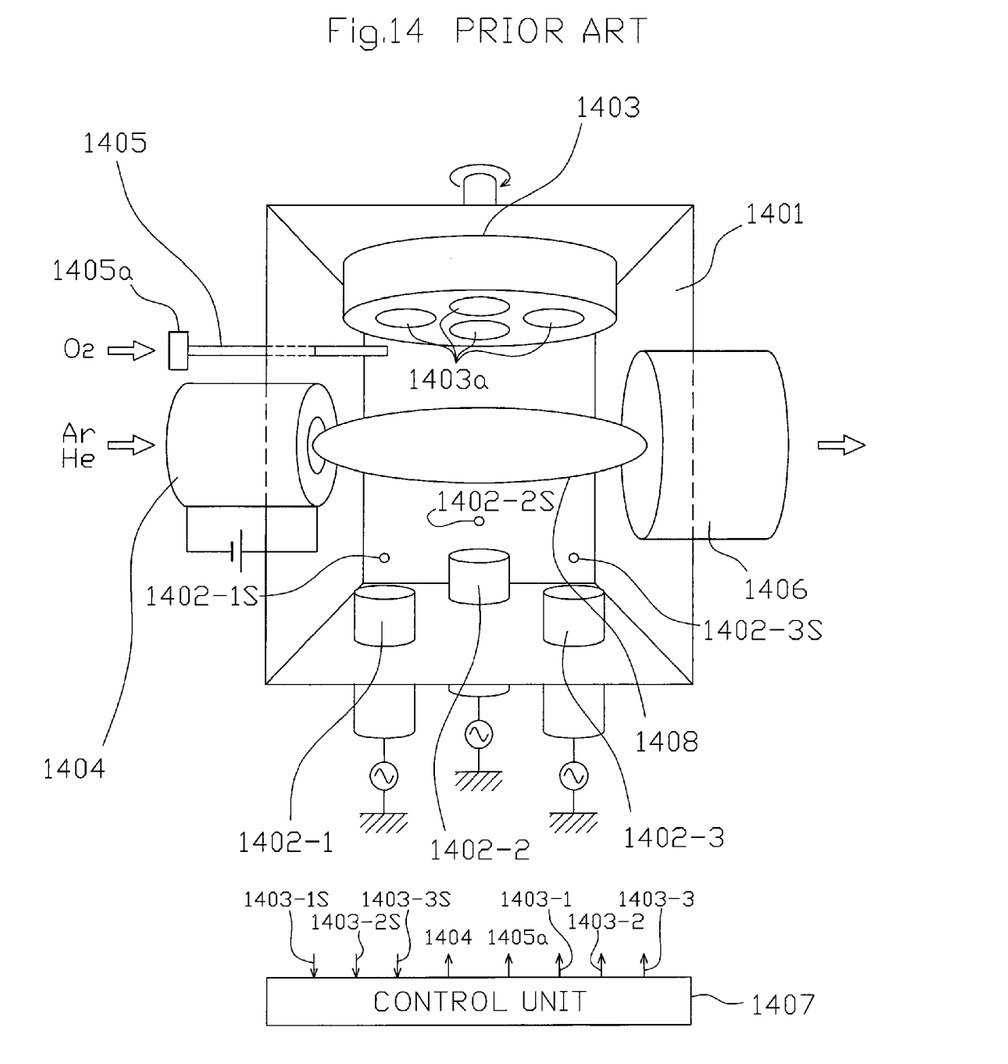
FIG. 14 is a diagram illustrating an ADRIP apparatus used in the ADRIP step of FIG. 13.

In FIG. 14, provided at a bottom portion of a vacuum chamber 1401 is a Pb evaporation source 1402-1, a Zr evaporation source 1402-2 and a Ti evaporation source 1402-3 for independently evaporating Pb, Zr and Ti, respectively.

The Pb evaporation source 1402-1, the Zr evaporation source 1402-2 and the Ti evaporation source 1402-3 are associated with a Pb evaporation amount sensor 1402-1S, a Zr evaporation amount sensor 1402-2S and a Ti evaporation amount sensor 1402-3S, respectively, for detecting Pb, Zr and Ti evaporation amounts within the vacuum chamber 1401.

Also, provided at an upper portion of the vacuum chamber 1401 is a heater incorporating wafer rotating holder 1403 for mounting a wafer 1403a.

Further, provided at an upstream side of the vacuum chamber 1401 area pressure gradient type arc discharge plasma gun 1404 for introducing insert gas such as Ar gas and He gas thereinto and an $O_2$ gas inlet pipe 1405 for introducing $O_2$ gas thereinto as material for the PZT piezoelectric layer 5A. The amount of $O_2$ gas introduced into the vacuum chamber 1401 is adjusted by an adjusting valve 1405a. On the other hand, provided at a downstream side of the vacuum chamber 1401 is an exhaust pipe 1406 coupled to a vacuum pump (not shown).

A control unit 1407 such as a microcomputer is provided to control the entire ADRIP apparatus of FIG. 14. Particularly, the control unit 1407 receives signals from the evaporation amount sensors 1402-1S, 1402-2S and 1402-3S to control the evaporation sources 1402-1, 1402-2 and 1402-3 as well as the pressure gradient type arc discharge plasma gun 1404 and the adjusting valve 1405a.

When the ADRIP apparatus of FIG. 14 carries out the ADRIP process at step 1301 of FIG. 13, the control unit 1407 operates the pressure gradient type arc plasma gun 1404 to receive Ar gas and He gas and generate arc discharge plasma 1408 at a high electron density and at a low electron temperature. Also, the control unit 1407 operates the adjusting valve 1405a to introduce $O_2$ gas into the vacuum chamber 1401. As a result, a large amount of active atoms and active molecules such as oxygen radicals are generated. On the other hand, Pb vapor, Zr vapor and Ti vapor generated from the Pb evaporation source 1402-1, the Zr evaporation source 1402-2 and the Ti evaporation source 1402-3 react with the above-mentioned active atoms and active molecules and are deposited on the wafer 1403a heated at about 500° C. As a result, $PbZr_xTi_{1-x}O_3$ with a composition ratio x is formed on the wafer 1403a.

Figure 15A:
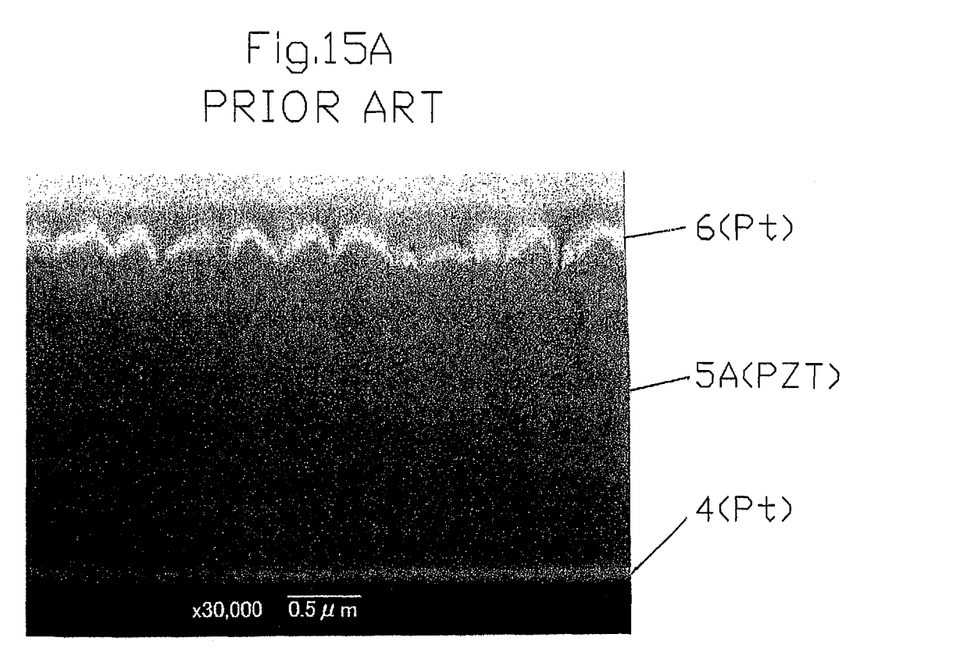
FIG. 15A is a scanning electron microscope (SEM) photograph illustrating a cross section of the Pt lower electrode layer and the PZT piezoelectric layer and the Pt lower electrode layer of FIG. 12.
Figure 15B:
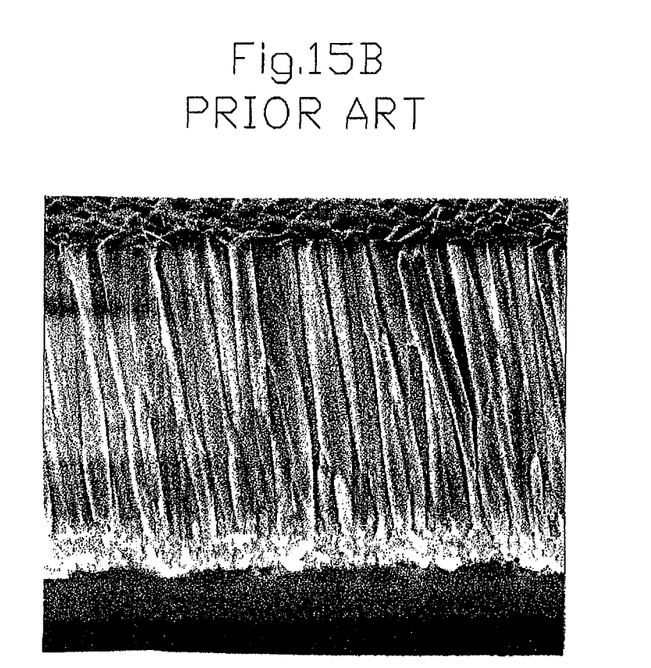
FIG. 15B is a scanning electron microscope (SEM) photograph illustrating a cross section of a comparative PZT piezoelectric layer which is used in the piezoelectric actuator of FIG. 1.

FIG. 15A is a scanning electron microscope (SEM) photograph illustrating a cross section of the tetragonal-system PZT piezoelectric layer 5A of the piezoelectric actuator of FIG. 12 whose composition x is close to that (x=0.52) of the morphotropic phase boundary. On the other hand, FIG. 15B is a SEM photograph illustrating a cross section of a PZT piezoelectric layer whose Ti component is richer than the PZT piezoelectric layer 5A (x<0.52). Both of the PZT piezoelectric layer 5A of FIG. 15A and the PZT piezoelectric layer of FIG. 15B have clear columnar structures exhibiting excellent orientation and breakdown characteristics. Note that the cut conditions of the layers of the SEM photographs of FIGS. 15A and 15B are different from each other.

Also, the piezoelectric layer of FIG. 15B will be used as a PZT piezoelectric layer 5B in the embodiment of the present invention.

In the fourth prior art piezoelectric actuator of FIG. 12, however, the PZT piezoelectric layer 5A has a large surface roughness, and accordingly, the Pt upper electrode layer 6 formed on the PZT piezoelectric layer 5A also has a large surface roughness. Therefore, when a DC voltage is applied between the Pt lower electrode layer 4 and the Pt upper electrode layer 6, a strong electric field would be locally focused so that the PZT piezoelectric layer 5A would be easily broken. Therefore, leakage paths L would be generated within grain boundaries in the PZT piezoelectric layer 5A corresponding to the lower protrusions of the Pt upper electrode layer 6. Thus, the breakdown voltage characteristics would deteriorate.

SUMMARY

The presently disclosed subject matter seeks to solve one or more of the above-described problems.

According to the presently disclosed subject matter, in a piezoelectric actuator including a lower electrode layer, a first PZT piezoelectric layer having a first relative permittivity is formed on the lower electrode layer, and a second PZT piezoelectric layer having a second relative permittivity smaller than the first relative permittivity is formed on the first PZT piezoelectric layer. Thus, the surface roughness of the second PZT piezoelectric layer becomes smaller than that of the first PZT piezoelectric layer.

On the one hand, in a method for manufacturing a piezoelectric actuator, a Pb evaporation amount, a Zr evaporation amount and a Ti evaporation amount are controlled by using an arc discharge ion plating process to form a first PZT piezoelectric layer made of $PbZr_xTi_{1-x}O_3$ having a first relative permittivity on a lower electrode layer, and a Pb evaporation amount, a Zr evaporation amount and a Ti evaporation amount are controlled by using an arc discharge ion plating process to form a second PZT piezoelectric layer made of $PbZr_xTi_{1-x}O_3$ having a second relative permittivity smaller than the first relative permittivity on the first PZT piezoelectric layer.

According to the presently disclosed subject matter, the large surface roughness of the first PZT piezoelectric layer having a large relative permittivity is compensated for by the second PZT piezoelectric layer having a small relative permittivity, so the generation of leakage paths can be suppressed, to remarkably improve the breakdown voltage characteristics.

BRIEF DESCRIPTION OF THE DRAWINGS

The above and other advantages and features of the presently disclosed subject matter will be more apparent from the following description of certain embodiments, taken in conjunction with the accompanying drawings, as compared with the prior art, wherein.

DETAILED DESCRIPTION OF EXEMPLARY EMBODIMENTS

Figure 1:
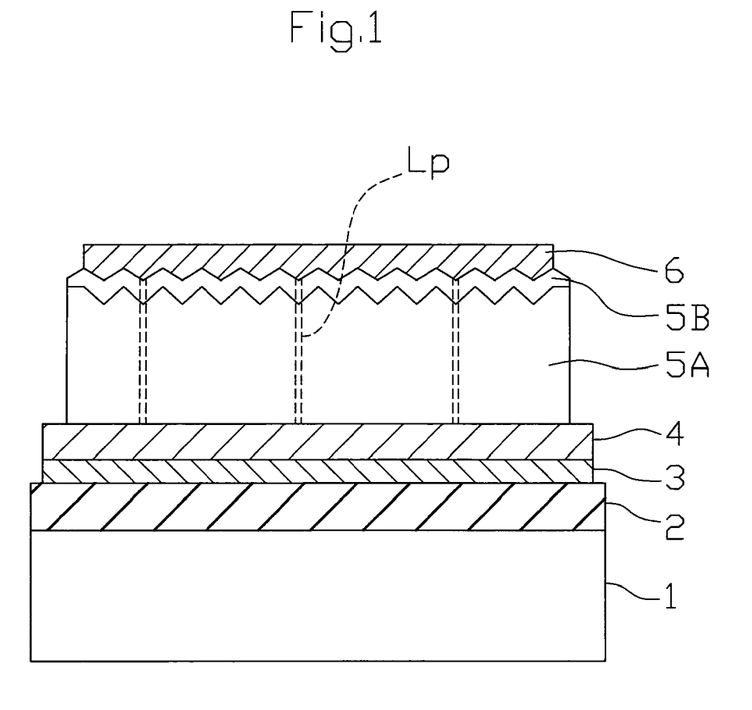
FIG. 1 is a cross-sectional view illustrating an embodiment of the piezoelectric actuator according to the presently disclosed subject matter.

In FIG. 1, which illustrates an embodiment of the piezoelectric actuator according to the presently disclosed subject matter, a PZT piezoelectric layer 5B having a lower permittivity $\in$ than that of the PZT piezoelectric layer 5A of FIG. 12 is formed thereon. Note that the composition x of $PbZr_xTi_{1-x}O_3$ of the PZT piezoelectric layer 5A is close to the morphotoropic phase boundary (MPB, generally, x=0.52) and belongs to a composition region (x<0.52) of a tetragonal-system structure of PZT.

Figure 2:
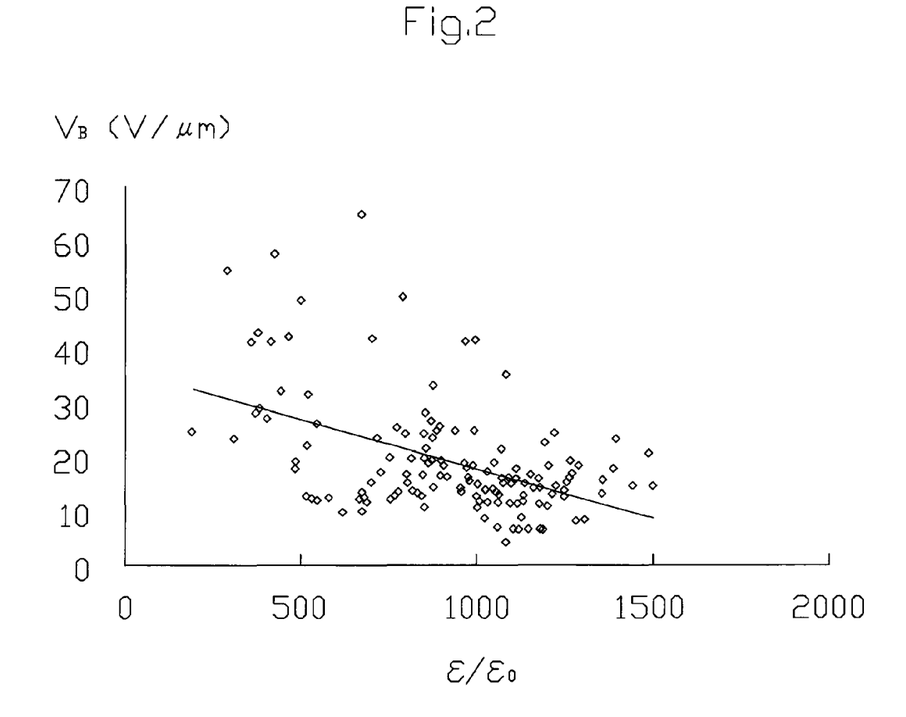
FIG. 2 is a graph showing the relationship between the relative permittivity and breakdown voltage characteristics of the PZT piezoelectric layers of FIG. 1.

In FIG. 2, which is a graph showing the relationship between the relative permittivity $\in/\in_0$ (E: permittivity of free space) and the breakdown voltage characteristics of the PZT piezoelectric layers 5A and 5B of FIG. 1, the larger the relative permittivity $\in/\in_0$, the smaller the breakdown voltage $V_B$. Note that the PZT piezoelectric layers 5A and 5B are formed by an ADRIP process.

Also, the permittivity $\in$ of the PZT piezoelectric layers has some relationship with the surface roughness. As illustrated in FIG. 1, the PZT piezoelectric layer 5A with a large permittivity $\in$ has a large surface roughness, while the PZT piezoelectric layer 5B with a small permittivity $\in$ has a small surface roughness. As a result, the surface roughness of the Pt upper electrode layer 6 formed on the PZT piezoelectric layer 5B is also small. Therefore, even when a DC voltage is applied between the Pt lower electrode layer 4 and the Pt upper electrode layer 6, an electric field is hardly locally focused and also, leakage paths LP are hardly generated along grain boundaries of the PZT piezoelectric layer 5B corresponding to the lower protrusions of the Pt upper electrode layer 6 as illustrated in FIG. 1. Thus, the breakdown voltage $V_B$ is further increased.

The smaller the permittivity $\in$ of the PZT piezoelectric layer 5B as compared with that of the PZT piezoelectric layer 5A, the smaller the surface roughness. However, the PZT piezoelectric layer 5B having a smaller permittivity $\in$ would deteriorate the performance of the PZT piezoelectric actuator of FIG. 1. For this reason, the relative permittivity $\in/\in_0$ of the PZT piezoelectric layer 5A is preferably larger than 1100, while the relative permittivity $\in/\in_0$ of the PZT piezoelectric layer 5B is preferably from 700 to 1000. Also, in order to improve the surface roughness while suppressing the deterioration of the performance of the piezoelectric actuator of FIG. 1, the thickness $t_B$ of the PZT piezoelectric layer 5B is defined by $$0.10 \leq t_B/(t_A+t_B) \leq 0.15$$

where $t_A$ is the thickness of the PZT piezoelectric layer 5A.

The permittivities $\in$ of the PZT piezoelectric layers 5A and 5B are determined by their oxygen components, Pb components, Pb/(Ti+Zr), the composition x of $PbZr_xTi_{1-x}O_3$ and so on. In this embodiment, the permittivities $\in$ of the PZT piezoelectric layers 5A and 5B are determined by the composition x of $PbZr_xTi_{1-x}O_3$. Generally, the closer to the morphotropic phase boundary (MPB where x=0.52), the larger the permittivity $\in$. Therefore, the composition x of the PZT piezoelectric layer 5B is larger than that of the PZT piezoelectric layer 5A, i.e., the PZT piezoelectric layer 5B is Ti-richer than the PZT piezoelectric layer 5A. For example, the composition x of the PZT piezoelectric layer 5A is from 0.52 to 0.43, while the composition x of the PZT piezoelectric layer 5B is from 0.45 to 0.40. In this case, the PZT piezoelectric layers 5A and 5B are both tetragonal. Also, even when their oxygen components, Pb components and Pb/(Ti+Zr) are changed, the relative permittivity $\in/\in_0$ of the PZT piezoelectric layer 5A can be assumed to be larger than 1100, while the relative permittivity $\in/\in_0$ of the PZT piezoelectric layer 5B can be assumed to be from 700 to 1000. In view of easily forming the PZT piezoelectric layer 5A as a single tetragonal-system crystal, the relative permittivity $\in/\in_{0.0}$ of the PZT piezoelectric layer 5A is preferably from 0.49 to 0.43.

The PZT piezoelectric layers 5A and 5B correspond to the PZT piezoelectric layers as illustrated in FIGS. 15A and 15B, respectively, which are, however, both constituted as single columnar layers of good orientation and good piezoelectric characteristics. Since the permittivity $\in$ of the PZT piezoelectric layer of FIG. 15A is larger than the permittivity $\in$ of the PZT piezoelectric layer of FIG. 15B, the piezoelectric characteristics of the PZT piezoelectric layer of FIG. 15A are better than those of the PZT piezoelectric layer of FIG. 15B. Also, the surface roughness of the PZT piezoelectric layer of FIG. 15B is smaller than that of the PZT piezoelectric layer of FIG. 15A, the piezoelectric characteristics of the PZT piezoelectric layer of FIG. 15B is better than those of the PZT piezoelectric layer of FIG. 15A.

Figure 3:
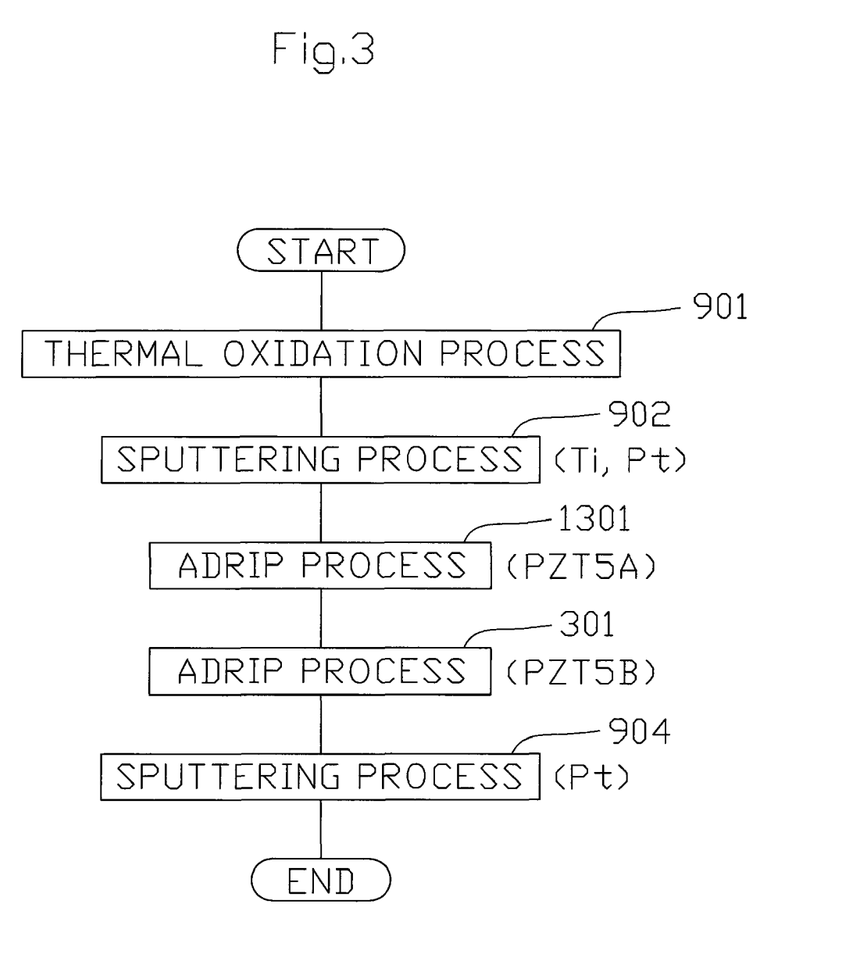
FIG. 3 is a flowchart for explaining a method for manufacturing the piezoelectric actuator of FIG. 1.

FIG. 3 is a flowchart for explaining a method for manufacturing the piezoelectric actuator of FIG. 1.

In FIG. 3, an ADRIP process step 301 for forming the Ti-richer PZT piezoelectric layer 5B than the PZT piezoelectric layer 5A is added to the steps of FIG. 13. In this case, the ADRIP process step 1301 for forming the PZT piezoelectric layer 5A having a larger permittivity $\in$ and the ADRIP process step 301 for forming the Ti-richer PZT piezoelectric layer 5B are sequentially carried out in the same ADRIP apparatus, thus preventing the process margin from being narrowed. Also, since the crystal growth of the PZT piezoelectric layers 5A and 5B is continuous, the interface therebetween is prevented from being cracked by the mechanical vibration of the piezoelectric actuator of FIG. 1, so that the piezoelectric actuator of FIG. 1 is prevented from being damaged.

The inventor's experiments are as follows.

Figure 4:
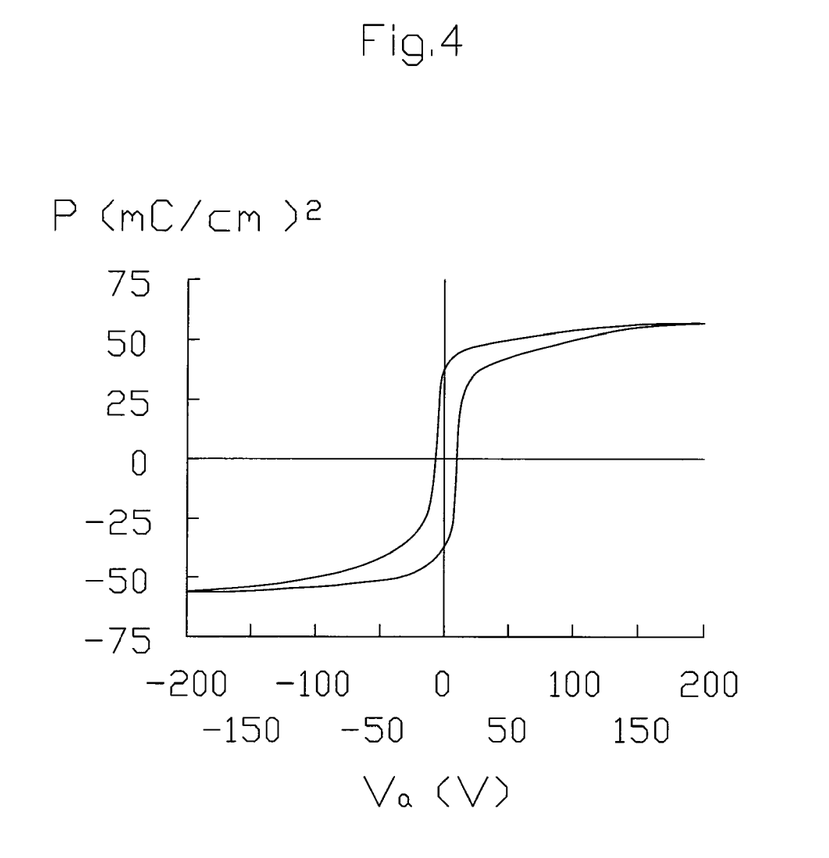
FIG. 4 is a graph for explaining the piezoelectric characteristics of the PZT piezoelectric actuator of FIG. 1.

In the piezoelectric actuator of FIG. 1, a 2.5 μm thick PZT piezoelectric layer 5A and a 0.3 μm thick PZT piezoelectric layer 5B were separately formed by the ADRIP apparatus. In this case, the relative permittivities of the PZT piezoelectric layers 5A and 5B were 1120 and 980, respectively. Also, a 2.5 μm thick PZT piezoelectric layer 5A and a 0.3 μm thick PZT piezoelectric layer 5B were sequentially formed by the ADRIP apparatus. In this case, the relative permittivity of the entirety of the PZT piezoelectric layers 5A and 5B was about 1090. As a result, a piezoelectric hysteresis curve as illustrated in FIG. 4 was obtained. Also, the breakdown voltage $V_B$ was 22.78V/μm. Further, the mean value Ra and the maximum height Rt of the surface roughness of the Pt upper electrode layer 6 were 65 Å and 580 Å, respectively. Still, the relative permittivity $\in/\in_0$ was 1051 and the dielectric loss efficiency was 2.12%.

Figure 5:
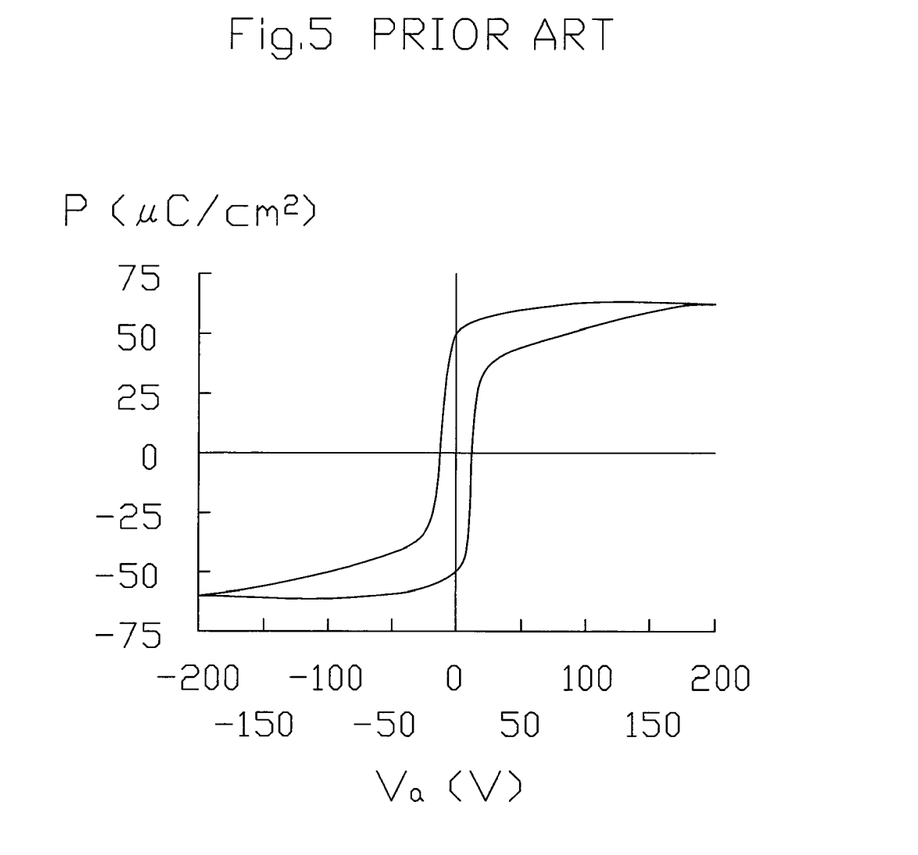
FIG. 5 is a graph for explaining the piezoelectric characteristics of the PZT piezoelectric actuator of FIG. 12.

On the other hand, in the piezoelectric actuator of FIG. 13, a 2.5 μm thick PZT piezoelectric layer 5A was formed by the ADRIP apparatus. In this case, the relative permittivity of the PZT piezoelectric layer 5A was 1120. As a result, a piezoelectric hysteresis curve as illustrated in FIG. 5 was obtained. Also, the breakdown voltage $V_B$ was 14.6V/μm. Further, the mean value Ra and the maximum height Rt of the surface roughness of the Pt upper electrode layer 6 were 103 Å and 1947 Å, respectively. Still, the relative permittivity $\in/\in_0$ was 1048 and the dielectric loss efficiency was 2.53%.

Thus, although the piezoelectric hysteresis curve, i.e., the piezoelectric characteristic of the piezoelectric actuator of FIG. 1 is almost the same as that of the piezoelectric actuator of FIG. 13, the surface roughness of the piezoelectric actuator of FIG. 1 is suppressed as compared with that of the piezoelectric actuator of FIG. 13, so that generation of leakage paths is suppressed, thus remarkably improving the breakdown voltage characteristics.

The presently disclosed subject matter is not limited to the PZT piezoelectric layers 5A and 5B of the above-mentioned embodiment. That is, the PZT piezoelectric layers 5A and 5B have only to satisfy the following condition: the composition x of the PZT piezoelectric layer 5A is larger than that of the PZT piezoelectric layer 5B, and smaller than the morphotropic phase boundary (MPB, generally, x=52); that is, the permittivity $\in$ of the PZT piezoelectric layer 5A is larger than that of the PZT piezoelectric layer 5B.

It will be apparent to those skilled in the art that various modifications and variations can be made in the presently disclosed subject matter without departing from the spirit or scope of the presently disclosed subject matter. Thus, it is intended that the presently disclosed subject matter covers the modifications and variations of the presently disclosed subject matter provided they come within the scope of the appended claims and their equivalents. All related or prior art references described above and in the Background section of the present specification are hereby incorporated in their entirety by reference.

The invention claimed is:

1. A piezoelectric actuator comprising:
    a lower electrode layer;
    a first PZT piezoelectric layer having a first relative permittivity formed on said lower electrode layer, and a second PZT piezoelectric layer having a second relative permittivity smaller than said first relative permittivity formed on said first PZT piezoelectric layer,
    wherein a composition x of $PbZr_xTi_{1-x}O_3$ of said first PZT piezoelectric layer is larger than a composition x of $PbZr_xTi_{1-x}O_3$ of said second PZT piezoelectric layer.

2. The piezoelectric actuator as set forth in claim 1, wherein said first relative permittivity is larger than 1100, and said second relative permittivity is from 700 to 1000.

3. The piezoelectric actuator as set forth in claim 1, wherein the composition x of $PbZr_xTi_{1-x}O_3$ of said first PZT piezoelectric layer is from 0.52 to 0.43, and the composition x of $PbZr_xTi_{1-x}O_3$ of said second PZT piezoelectric layer is from 0.45 to 0.40.

4. The piezoelectric actuator as set forth in claim 1, wherein thicknesses $t_A$ and $t_B$ of said first and second PZT piezoelectric layers satisfy:

$$0.10 \leq t_B/(t_A+t_B) \leq 0.15.$$

* * * * *